(12) United States Patent
Tamagawa (10) Patent No.: US 7,545,198 B2
(45) Date of Patent: Jun. 9, 2009

(54) SEMICONDUCTOR DEVICE (75) Inventor: Akio Tamagawa, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 83 days.

(21) Appl. No.: 11/582,349

(22) Filed: Oct. 18, 2006

(65) Prior Publication Data
US 2007/0103223 A1    May 10, 2007

(30) Foreign Application Priority Data
Oct. 20, 2005   (JP)   ............... 2005-305225

(51) Int. Cl.
H03K 17/687 (2006.01)
(52) U.S. Cl. ...................... 327/427; 327/434
(58) Field of Classification Search ................ 327/427, 327/434, 110
See application file for complete search history.

(56) References Cited
U.S. PATENT DOCUMENTS
4,551,779 A * 11/1985 Murakami et al. ............ 361/86

6,538,480 B2 * 3/2003 Takada et al. ............... 327/108
6,724,227 B2 * 4/2004 Imai ........................... 327/108

FOREIGN PATENT DOCUMENTS
DE   92 17 565 U1   3/1993
EP   0 206 505      5/1986
JP   2002-185299 A  6/2002
JP   2005-033876 A  2/2005

* cited by examiner

Primary Examiner—Lincoln Donovan
Assistant Examiner—Adam D Houston
(74) Attorney, Agent, or Firm—Foley & Lardner LLP (57) ABSTRACT A semiconductor device includes an output MOS transistor to control a current flowing into an L-load in accordance with a gate signal input to its gate. A level shifter shifts the level of an input signal based on a power supply voltage at a Vcc terminal to generate the gate signal. A control signal adjuster detects an output voltage between the L-load and the output MOS transistor based on the power supply voltage and adjusts the level of the gate signal.

7 Claims, 8 Drawing Sheets

SEMICONDUCTOR DEVICE

BACKGROUND OF THE INVENTION

1. Field of the Invention

The present invention relates to a semiconductor device including a driver to drive a control signal of a switching element.

2. Description of Related Art

A relay which has been used in an engine control unit etc. as an automotive product is recently replaced by a semiconductor device such as a power MOSFET (Metal Oxide Semiconductor Field Effect Transistor) with no contact point. Further, an IPD (Intelligent Power Device) which includes a current limiter, an overheat detector and so on in addition to a power MOSFET is recently employed.

Figure 5:
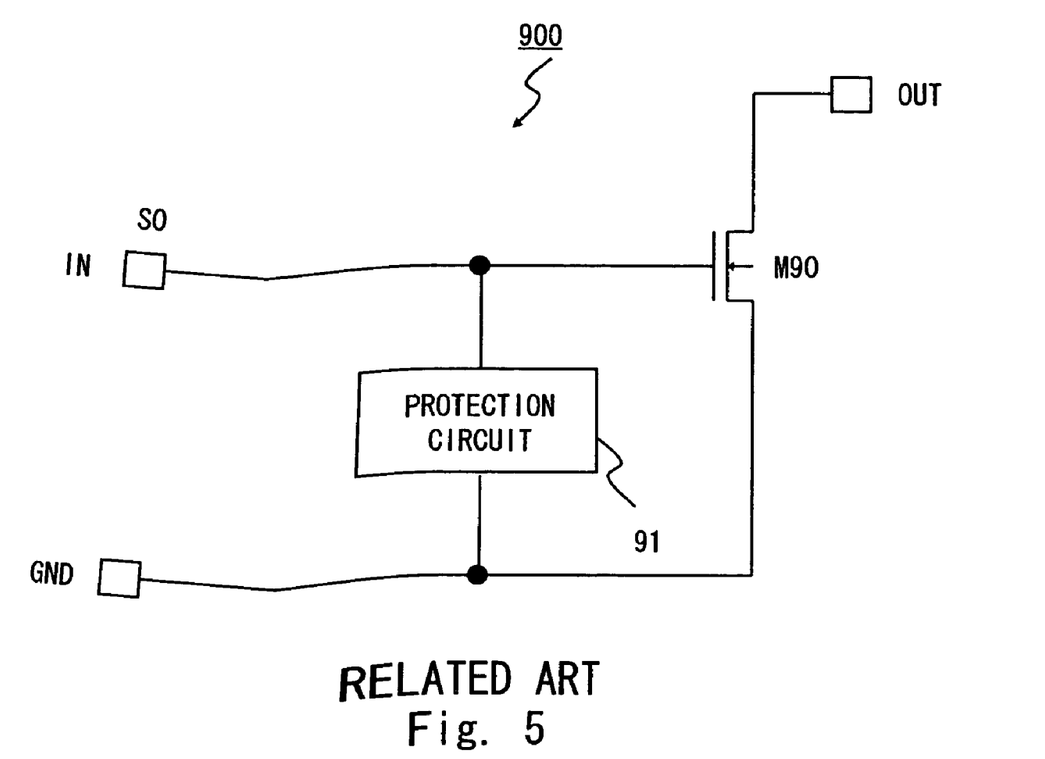
FIG. 5 is a circuit diagram showing the configuration of a semiconductor device according to a related art.

FIG. 5 illustrates an example of an IPD according to a related art. The IPD 900 of FIG. 5 has a withstand output voltage of 60V and can be driven at 5V. As shown in FIG. 5, the IPD 900 includes an output MOS transistor M90 which is connected between an OUT terminal and a GND terminal. The gate of the output MOS transistor M90 is connected to an IN terminal. The IPD 900 is driven according to a control signal of a microcomputer. A 5V drive signal S0 is input to the IN terminal from the microcomputer. The IPD 900 further includes a protector 91 having a current limiter, an overheat detector and so on which is connected between the IN terminal and the GND terminal to thereby protect the output MOS transistor M90 from overcurrent and overheating.

A load (L-load) containing inductance is connected to the OUT terminal. The load is driven by turning on/off the output MOS transistor M90. Because the load is connected between a power supply and a switch so that the switch is located on the low-voltage side of the load, the IPD serves as a low-side switch in this configuration.

Figure 6:
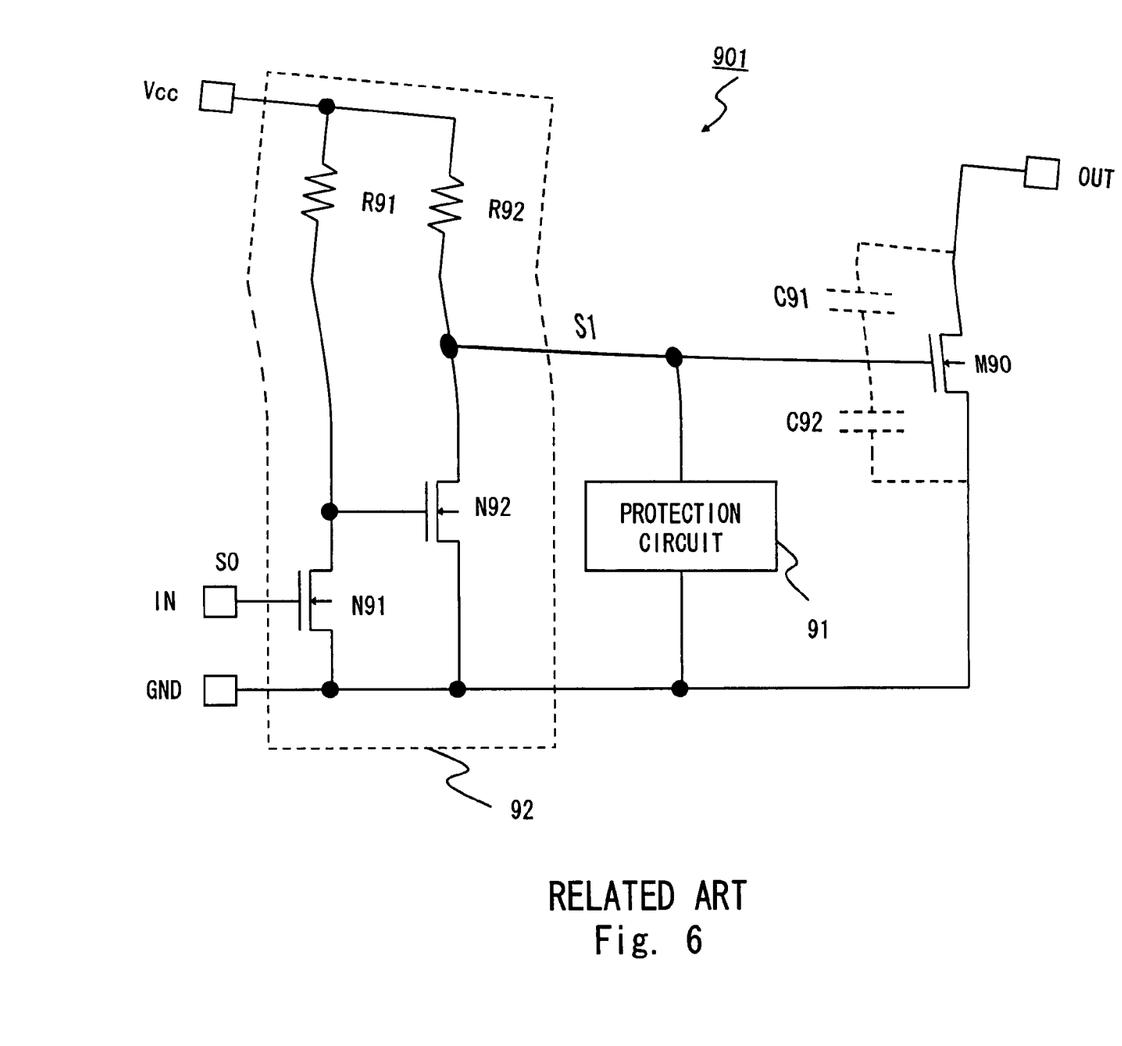
FIG. 6 is a circuit diagram showing the configuration of a semiconductor device according to a related art.

FIG. 6 illustrates another example of an IPD according to a related art. The IPD 901 of FIG. 6 has a withstand output voltage of 100V or higher. In the IPD 901 with such a high withstand output voltage, the output MOS transistor M90 has degraded on-resistance characteristics, and it is necessary to drive the output MOS transistor M90 with a highest possible gate voltage. Therefore, the IPD 901 includes a level shifter 92 which converts the drive signal S0 of 5V into a gate signal S1 of 14V at a battery voltage level.

In the level shifter 92, a resistor R91 and a MOS transistor N91 connected in series and a resistor R92 and a MOS transistor N92 also connected in series are connected in parallel between a Vcc terminal and a GND terminal. The level shifter 92 shifts the level of the drive signal S0 input to the IN terminal to the level of the voltage supplied to the Vcc terminal, and outputs the level-shifted gate signal S1 to the gate of the output MOS transistor M90.

Figure 7A:
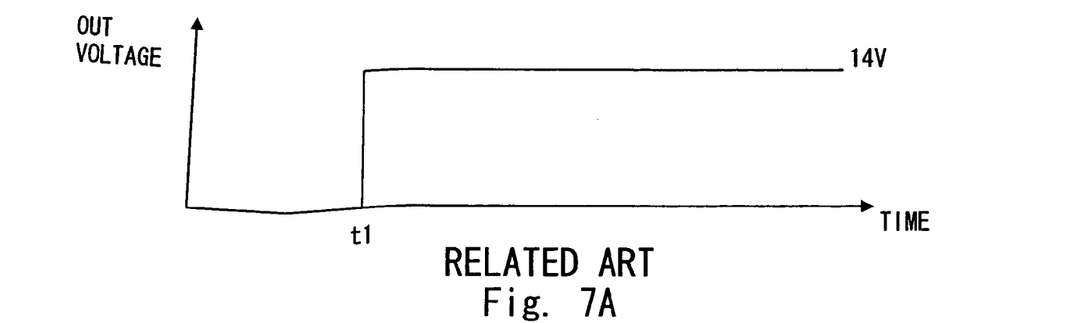
FIG. 7A is a view showing the waveform of a voltage at an OUT terminal when no voltage is applied to a Vcc terminal in an IPD according to a related art.
Figure 7B:
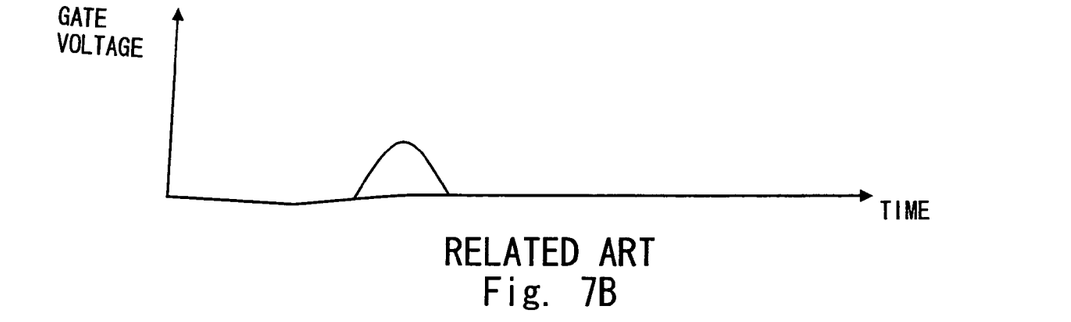
FIG. 7B is a view showing the waveform of a gate voltage of an output MOS transistor when no voltage is applied to a Vcc terminal in an IPD according to a related art.
Figure 7C:
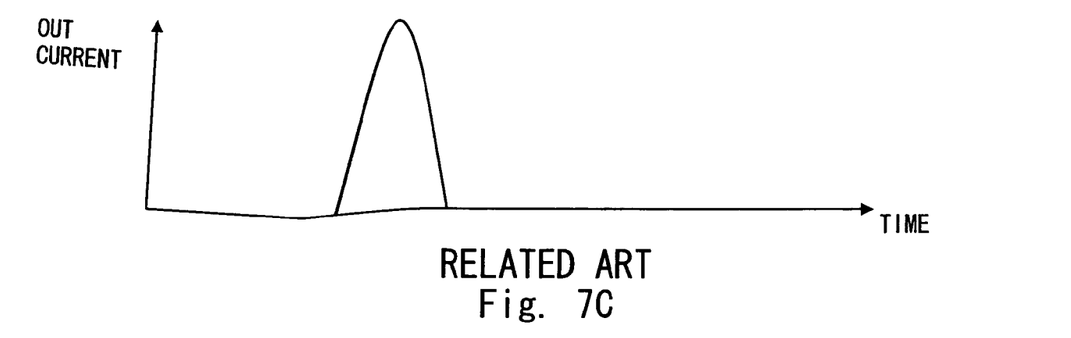
FIG. 7C is a view showing the waveform of a current at an OUT terminal when no voltage is applied to a Vcc terminal in an IPD according to a related art.

FIGS. 7A to 7C illustrate waveforms where no voltage is applied to the Vcc terminal in the IPD 901. FIG. 7A shows the voltage at the OUT terminal, FIG. 7B shows the gate voltage at the output MOS transistor M90, and FIG. 7C shows the current at the OUT terminal.

In the IPD 901, when no voltage is applied to the Vcc terminal, the gate signal S1 is not output from the level shifter 92, and the gate voltage at the output MOS transistor M90 is 0V. If a steep voltage rise occurs to cause a step-like voltage change at the OUT terminal in time t1 as shown in FIG. 7A, the gate voltage of the output MOS transistor M90 increases due to parasitic capacitors C91 and C92 of the output MOS transistor M90 as shown in FIG. 7B. This causes the output MOS transistor M90 to temporally turn on, which causes a current to flow to the OUT terminal as shown in FIG. 7C.

The IPD 901 of a related art has a drawback that the steep voltage rise occurring at the OUT terminal results in a current flow to the OUT terminal.

As a technique to overcome such a drawback, Japanese Unexamined Patent Application Publication No. 2002-185299 (Seki) discloses a semiconductor device to reduce a through current of an output transistor. This semiconductor device increases the output impedance of an output driver when no power is supplied to a pre-driver to thereby prevent a through current from flowing into the output driver.

Figure 8:
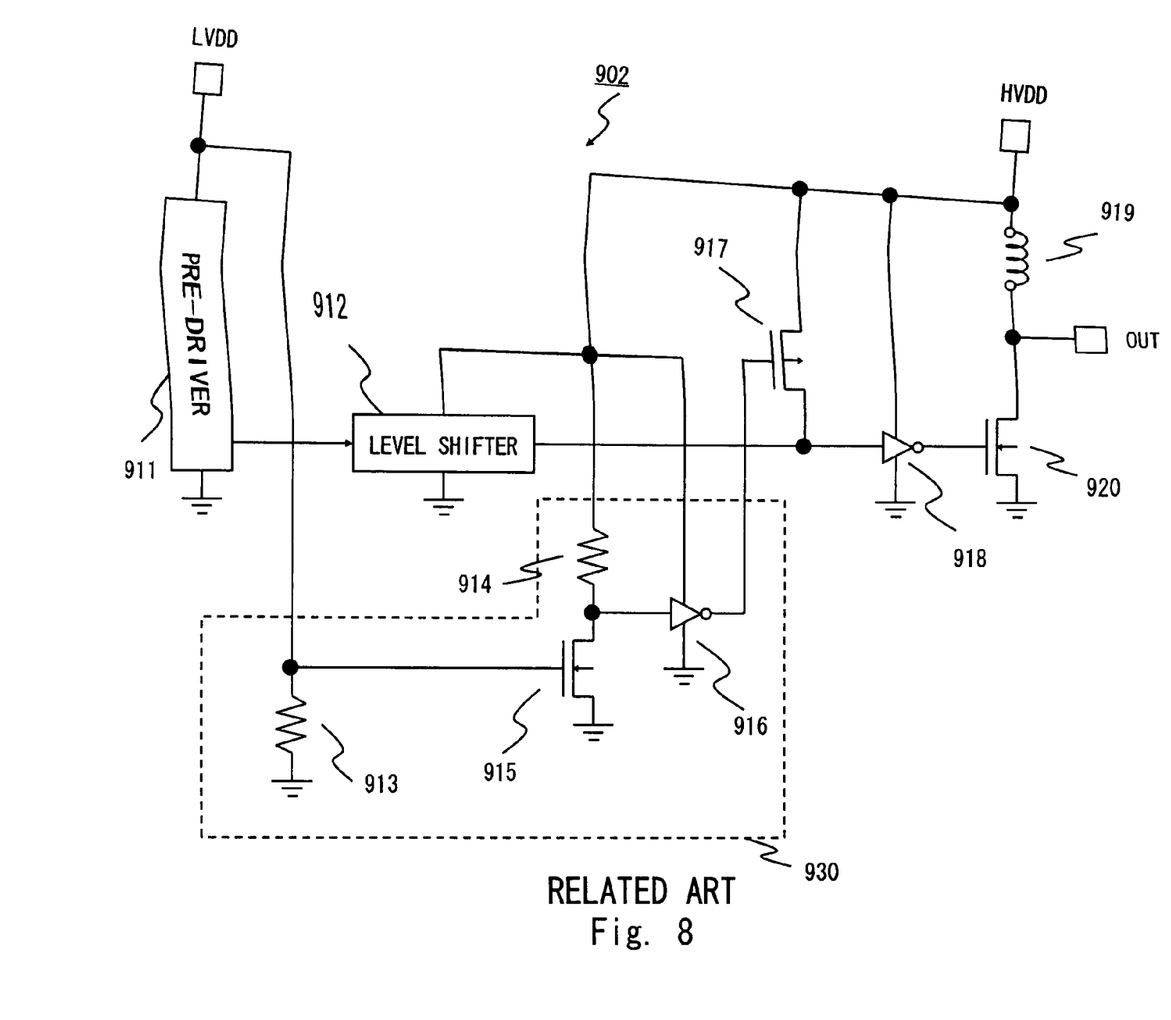
FIG. 8 is a circuit diagram showing the configuration of a semiconductor device according to a related art.

FIG. 8 illustrates a case where the semiconductor device with push-pull structure taught by Seki is applied to a low-side IPD with open-drain structure.

In the IPD 902 of FIG. 8, the output of a pre-driver 911 is shifted by a level shifter 912 and then inverted by an inverter 918 to thereby turn on/off an output MOS transistor 920 and drive an L-load 919. The IPD 902 also includes a power supply voltage detector 930 to detect the voltage at a power supply terminal LVDD.

The power supply voltage detector 930 cuts off the output MOS transistor 920 when no voltage is supplied to the power supply terminal LVDD of the pre-driver 911. Specifically, when a voltage is not supplied to the power supply terminal LVDD, an Nch MOS transistor 915 of the power supply voltage detector 930 is off. Then, an inverter 916 outputs a Low level according to the voltage between a power supply terminal HVDD and the L-load 919, a Pch MOS transistor 917 thereby turns on, and the inverter 918 outputs a Low level. The output MOS transistor 920 is thereby cutoff (turns off).

In the IPD 902, however, when no voltage is supplied to the power supply terminal HVDD, the power supply voltage detector 930 does not operate and the output of the inverter 918 is indeterminate. In the state where the power supply voltage is low and the inverter is unstable, if a voltage is applied to the OUT terminal through the L-load 919, the gate voltage of the output MOS transistor 920 increases to cause the output MOS transistor 920 to turn on, thus failing to overcome the drawback that a current flows to the L-load 919.

As described in the foregoing, in the semiconductor device such as the IPD of a related art, a steep, step-like voltage rise occurring at an OUT terminal causes an increase in the gate voltage of the OUT terminal due to parasitic capacitors of an output MOS transistor, which undesirably results in a current flowing into the OUT terminal.

There is a case where supply of power is controlled through separate power switches even when the power supply connected to an OUT terminal and a Vcc terminal is the same battery voltage. In such a case, due to a time lag between turn-on timing of the respective power switches, a voltage can be applied to the OUT terminal through an L-load when no voltage is applied to a level shifter, thus causing the above drawback to occur.

An L-load connected to an IPD is typically a coil for turn on/off an electromagnetic relay or a coil used in an injector to inject fuel to an engine. A current flowing into such a coil causes erroneous operation of the electromagnetic relay or the injector, and this is very serious problem in terms of reliability as a component which is used for an engine control unit as an automotive product, which should place ultimate priority on the safety.

SUMMARY OF THE INVENTION

According to an aspect of the present invention, there is provided a semiconductor device including a switching element to control a current flowing into a load in accordance with a control signal input to a control terminal, a level shifter to shift a level of an input signal based on a power supply voltage to generate the control signal, and a control signal adjuster to detect an output voltage between the load and the switching element based on the power supply voltage and adjusting a level of the control signal.

The semiconductor device suppresses an increase in the level of a control signal when a power supply voltage of the level shifter is low and a high voltage is applied to the switching element to reduce an output current flowing into the load, thereby preventing erroneous operation of the load. Further, the semiconductor device detects a voltage between the load and the switching element and directly adjusts the control signal input to the switching element, thereby accurately controlling the switching element.

According to another aspect of the present invention, there is provided a semiconductor device including an output transistor connected between an output terminal connected with a load and a low-voltage terminal, a level shifter connected between a high-voltage terminal and the low-voltage terminal, to input a control signal generated by level-shifting an input signal to a control terminal of the output transistor, a first voltage detection transistor to control an electrical connection between the output terminal and the low-voltage terminal in accordance with a voltage at the high-voltage terminal, and a second voltage detection transistor to control an electrical connection between the control terminal of the output transistor and the low-voltage terminal in accordance with a voltage at the output terminal.

The semiconductor device suppresses an increase in the level of a control signal when a voltage at the high-voltage terminal is low and a high voltage is applied to the output transistor to thereby maintain the output transistor in the off-state. This prevents an output current from flowing into the load, thereby preventing erroneous operation of the load. Specifically, the semiconductor device controls an electrical connection between the control terminal of the output transistor and the low-voltage terminal in accordance with the voltage at the output terminal to thereby maintain the output transistor in the off-state.

According to yet another aspect of the present invention, there is provided a semiconductor device including an output terminal connected to a power supply through a load, an output transistor to control a current flowing into the load through the output terminal, and a pull-down circuit to pull down the output transistor in accordance with a voltage at the output terminal when a voltage at a high-voltage terminal through which power is supplied is equal to or lower than a prescribed level.

The semiconductor device pulls down the output transistor in accordance with the voltage at the output terminal when the voltage at the high-voltage terminal is equal to or lower than a prescribed level, thereby preventing the output transistor from turning on when a step-like voltage rise occurs at the output terminal.

The present invention provides a semiconductor device which is capable of suppressing an output current flowing into a load when a power supply to a controller such as a level shifter is low to thereby prevent erroneous operation of the load.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A semiconductor device according to a first exemplary embodiment of the present invention is described hereinafter. The semiconductor device of this embodiment utilizes a voltage applied to an OUT terminal when no voltage is supplied to a level shifter to prevent a current from flowing into the OUT terminal to cause erroneous operation of a load which is connected to the OUT terminal.

Figure 1:
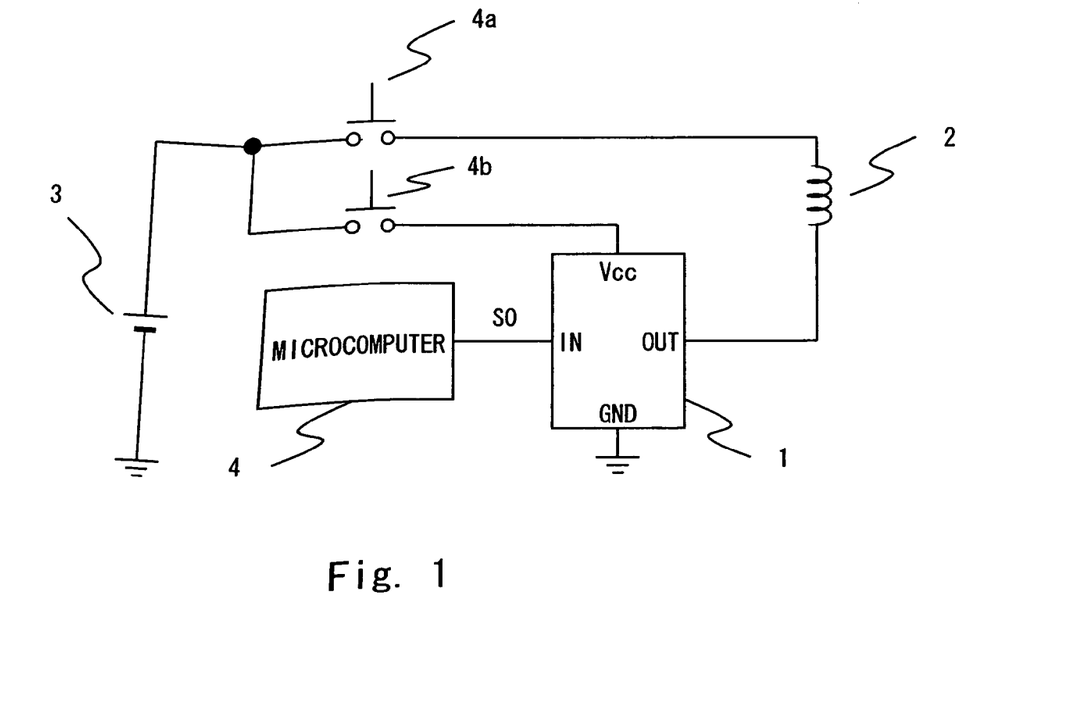
FIG. 1 is a block diagram of a system including a semiconductor device according to an embodiment of the present invention.

Referring first to FIG. 1, the configuration of a system including the semiconductor device of this embodiment is described hereinbelow. This system may be used as an automotive system and it controls a current flowing into an L-load 2. The system includes the semiconductor device 1, the L-load 2, a power supply 3, and a microcomputer 4. The semiconductor device 1 and the microcomputer 4 may be respectively an integrated circuit of one chip or a plurality of chips.

The microcomputer 4 is connected to the semiconductor device 1 and supplies a drive signal S0 to control the current flowing into the L-load 2 to the semiconductor device 1. The microcomputer 4 may output a 5V drive signal S0.

The semiconductor device 1 is an IPD and controls the current flowing into the L-load 2 in accordance with the drive signal S0 received from the microcomputer 4. The semiconductor device 1 has an IN terminal (input terminal) connected to the microcomputer 4, an OUT terminal (output terminal) connected to one end of the L-load 2, and a GND terminal connected to the ground. The semiconductor device 1 is connected to a low-voltage side (a side closer to the GND than to the power supply) of the L-load 2 and thereby operates as a low-side switch. The semiconductor device 1 may have a withstand output voltage of 100V or higher and be driven at 14V. Accordingly, the power supply voltage of 14V is supplied from the power supply 3 to the Vcc terminal of the semiconductor device 1 through a power switch 4b.

One end of the L-load 2 is connected to the semiconductor device land the other end is connected to the power supply 3 through a power switch 4a. The L-load 2 is a load containing inductance, which may be an actuator such as a coil. When a current flows through the L-load 2 by the control of the semiconductor device 1, the L-load 2 converts the current into mechanical work.

The power switch 4a is a switch to turn on/off the power supply to the L-load 2. The power switch 4b is a switch to turn on/off the power supply to the semiconductor device 1. Because the power switch for the L-load 2 and the power switch for the semiconductor device 1 are separate in this example, time lag is likely to occur between the timing to supply power to the L-load 2 and the semiconductor device 1. The power supply to the L-load 2 and the semiconductor device 1 may be controlled by a single power switch. The time lag in power supply timing can occur even with the use of a single power switch because of a difference in distance from the power switch to the L-load 2 and the semiconductor device 1, a difference in component, and so on.

Figure 2:
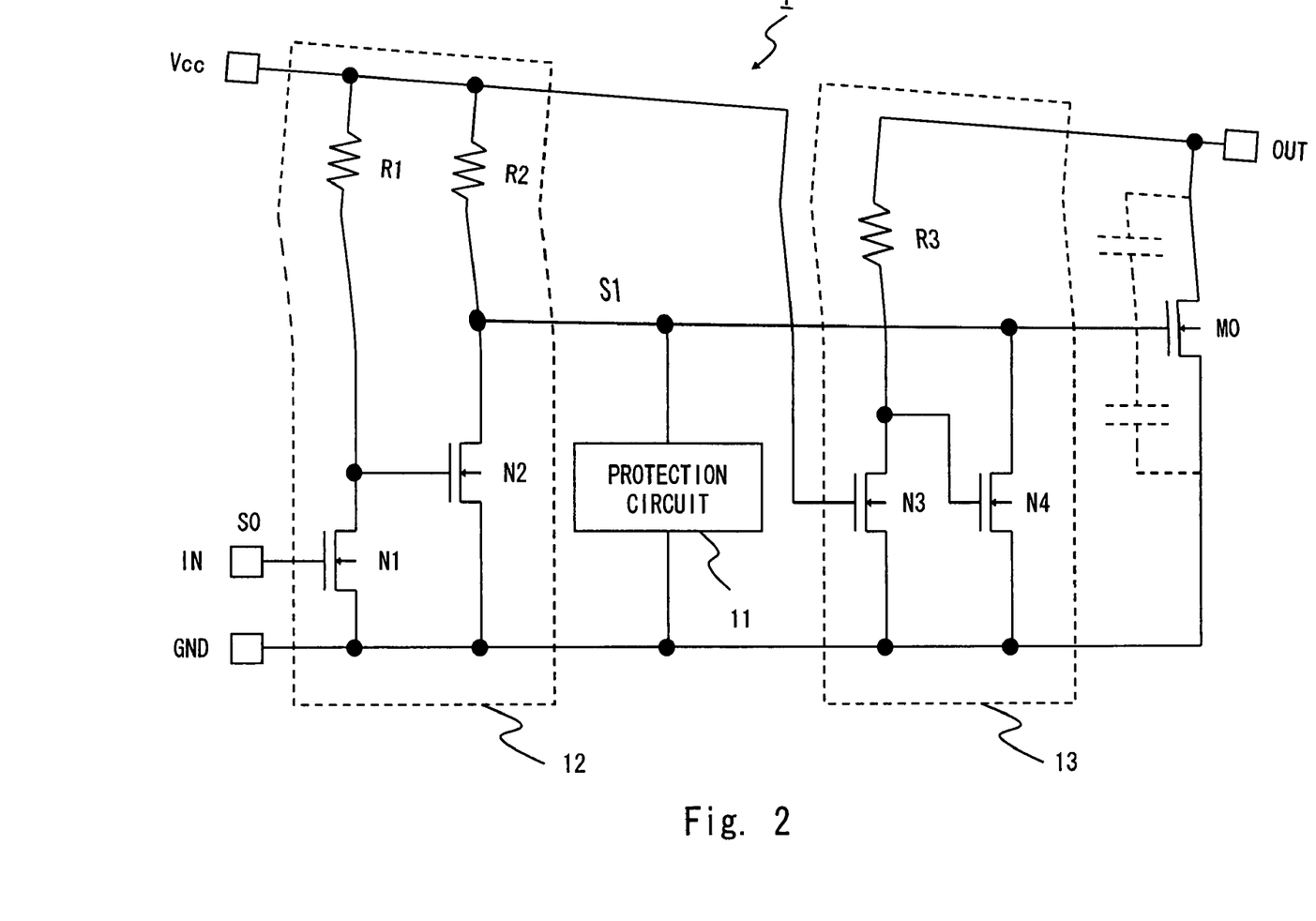
FIG. 2 is a circuit diagram showing the configuration of a semiconductor device according to an embodiment of the present invention.

Referring next to the circuit diagram of FIG. 2, the configuration of the semiconductor device according to this embodiment is described hereinbelow. As shown in FIG. 2, the semiconductor device 1 includes an output MOS transistor M0, a protection circuit 11, a level shifter 12, and a gate pull-down circuit 13.

The output MOS transistor M0 is a switching element to control the current flowing into the L-load 2, and it may be a vertical MOS transistor capable of high power operation. The output MOS transistor M0 turns on or off in accordance with a gate signal (control signal) S1 input to its gate to thereby control the current flowing into the L-load 2. Although the output MOS transistor M0 may be either Nch type or Pch type, it is described as an Nch output MOS transistor in the following description. The output MOS transistor M0 is connected between the OUT terminal and the GND terminal. The output MOS transistor M0 has the drain connected to the OUT terminal (output terminal), the source connected to the GND terminal (low-voltage terminal), and the gate (control terminal) connected to the level shifter 12, the protection circuit 11, and the gate pull-down circuit 13.

The level shifter 12 is a booster to output a signal having a higher voltage than the voltage of an input signal. The level shifter 12 shifts the level of a drive signal S0 input through the IN terminal to generate a gate signal S1 and outputs the generated gate signal S1 to the gate of the output MOS transistor M0. The voltage of the gate signal S1 which is generated by level shifting is a level which drops from the voltage at the Vcc terminal by the amount of resistance R2, and it is substantially equal to the voltage at the Vcc terminal.

The level shifter 12 includes a resistor R1 and an Nch MOS transistor N1 which are connected in series between the Vcc terminal (high-voltage terminal) and the GND terminal, and a resistor R2 and an Nch MOS transistor N2 which are also connected in series between the Vcc terminal and the GND terminal. The resistor R1 and the Nch MOS transistor N1, the resistor R2 and the Nch MOS transistor N2 may be respectively composed of an inverter. The MOS transistor N1 has the drain connected to the Vcc terminal through the resistor R1, the gate connected to the IN terminal, and the source connected to the GND terminal. The MOS transistor N2 has the drain connected to the Vcc terminal through the resistor R2, the gate connected to the node between the resistor R1 and the MOS transistor N1, and the source connected to the GND terminal. The node between the MOS transistor N2 and the resistor R2 serves as an output terminal for the gate signal S1 and it is connected to the gate of the output MOS transistor M0.

If, for example, the voltage at the IN terminal is lower than a threshold of the MOS transistor N1, the MOS transistor N1 is off, and a node voltage between the resistor R1 and the MOS transistor N1 is higher than the GND voltage; therefore, the MOS transistor N2 turns on, and the level of the gate signal S1 equals the GND voltage. If, on the other hand, the voltage at the IN terminal is equal to or hither than a threshold of the MOS transistor N1, the MOS transistor N1 turns on, and a node voltage between the resistor R1 and the MOS transistor N1 decreases; therefore, the MOS transistor N2 turns off, and the level of the gate signal S1 is shifted to the voltage at the Vcc terminal.

The protection circuit 11 is connected between the gate of the output MOS transistor M0 and the GND terminal. The protection circuit 11 includes a current limiter and an overheat detector to protect the output MOS transistor M0 from overcurrent and overheating. Upon detection of overcurrent or overheating, the protection circuit 11 short-circuits between the gate of the output MOS transistor M0 and the GND terminal to discharge the gate of the output MOS transistor M0 to the GND terminal so that the output MOS transistor M0 turns off, thereby preventing breakdown of the output MOS transistor. In the semiconductor device 1, the circuit to control the operation of the output MOS transistor M0, which is referred to as a controller, includes the protection circuit 11 and the level shifter 12.

The gate pull-down circuit 13 serves as a control signal adjuster which detects an output voltage at the OUT terminal between the L-load 2 and the output MOS transistor M0 based on the power supply voltage at the Vcc terminal and adjusts the gate signal (control signal) S1 of the output MOS transistor M0.

The gate pull-down circuit 13 includes a resistor R3, an Nch MOS transistor N3, and an Nch MOS transistor N4. The resistor R3 and the Nch MOS transistor N3 are connected in series between the OUT terminal and the GND terminal. The Nch MOS transistor N4 is connected between the gate of the output MOS transistor M0 and the GND terminal.

The MOS transistor N3 serves as a power supply voltage detector, a first voltage detection transistor, or a first voltage detector to detect a voltage at the Vcc terminal, and it detects that the power supply voltage is equal to or lower than a first level (a threshold of the MOS transistor N3). The MOS transistor N3 has the drain connected to the OUT terminal through the resistor R3, the gate connected to the Vcc terminal, and the source connected to the GND terminal. The MOS transistor N3 electrically connects or disconnects between the resistor R3 and the GND terminal in accordance with the voltage at the Vcc terminal.

The MOS transistor N4 serves as an output voltage detector, a second voltage detection transistor, or a second voltage detector to detect a voltage at the OUT terminal based on the detection of the power supply voltage by the MOS transistor N3 and adjusting the gate voltage of the output MOS transistor M0 (discharging the gate charge). The MOS transistor N4 operates to detect the output voltage at the OUT terminal when the power supply voltage at the Vcc terminal is equal to or less than the first level and, if the output voltage is equal to or higher than a second level (a threshold of the MOS transistor N4), the MOS transistor N4 adjusts the gate voltage of the output MOS transistor M0. Specifically, if the output voltage is equal to or higher than the second level, the MOS transistor N4 pull-downs the gate of the output MOS transistor M0.

The MOS transistor N4 reduces the gate voltage of the output MOS transistor M0 to at least below the threshold of the output MOS transistor M0 in order to maintain the off-state of the output MOS transistor M0. The MOS transistor N4 has the drain connected to the gate of the output MOS transistor M0, the gate connected to the node between the resistor R3 and the MOS transistor N3, and the source connected to the GND terminal. The MOS transistor N4 electrically connects or disconnects between the gate of the output MOS transistor M0 and the GND terminal in accordance with the voltage at the node between the resistor R3 and the MOS transistor N3, i.e. the voltage at the OUT terminal. A GND voltage is supplied to the gate of the output MOS transistor M0 when the gate of the output MOS transistor M0 and the GND terminal are electrically connected.

For example, if the voltage at the Vcc terminal is equal to or higher than the threshold of the MOS transistor N3, the MOS transistor N3 turns on to reduce the node voltage between the resistor R3 and the MOS transistor N3, so that the MOS transistor N4 turns off. Because the gate of the output MOS transistor M0 and the GND terminal are thereby not connected, the gate signal S1 generated by the level shifter 12 is input to the gate of the output MOS transistor M0 as it is; as a result, the output MOS transistor M0 turns on or off in accordance with the gate signal S1.

Figure 3A:
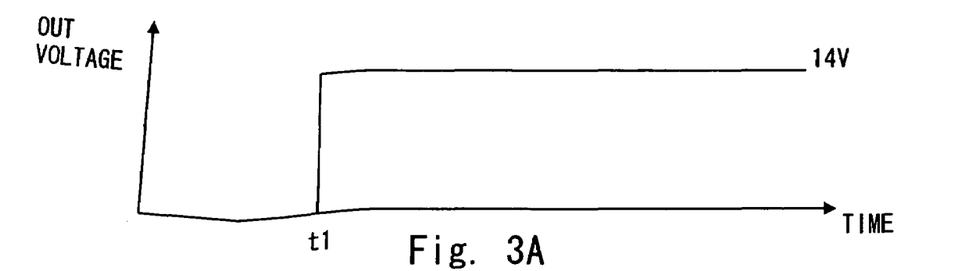
FIG. 3A is a view showing the waveform of a voltage at an OUT terminal when no voltage is applied to a Vcc terminal in a semiconductor device according to an embodiment of the present invention.
Figure 3B:
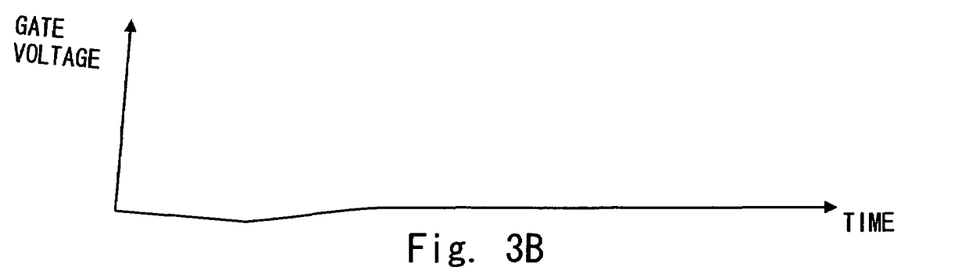
FIG. 3B is a view showing the waveform of a gate voltage of an output MOS transistor when no voltage is applied to a Vcc terminal in a semiconductor device according to an embodiment of the present invention.
Figure 3C:
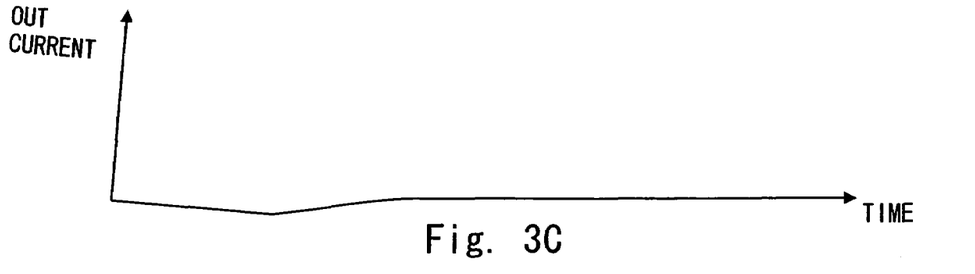
FIG. 3C is a view showing the waveform of a current at an OUT terminal when no voltage is applied to a Vcc terminal in a semiconductor device according to an embodiment of the present invention.

Referring now to the timing charts of FIGS. 3A to 3C, the operation to adjust the gate signal by the gate pull-down circuit 13 when the voltage at the Vcc terminal is 0V or the power supply switch 4b is open is described hereinbelow. FIGS. 3A to 3C show the waveforms where no voltage is applied to the Vcc terminal. FIG. 3A shows the voltage at the OUT terminal, FIG. 3B shows the gate voltage of the output MOS transistor M0, and FIG. 3C shows the current at the OUT terminal.

If the voltage at the Vcc terminal is 0V or the power supply switch 4b is open, the gate signal S1 is not output from the level shifter 12, and thereby the gate voltage of the output MOS transistor M0 is 0V (ground level). Further, because the voltage at the Vcc terminal, which is 0V, is lower than the threshold of the MOS transistor N3, the MOS transistor N3 turns off and the node voltage between the resistor R3 and the MOS transistor N3 is at the level corresponding to the voltage at the OUT terminal.

In this condition, when a steep, step-like voltage rise occurs at t1 as shown in FIG. 3A, the node voltage between the resistor R3 and the MOS transistor N3 also rises step-like accordingly. If the node voltage reaches the threshold of the MOS transistor N4, the MOS transistor N4 turns on. As a result, the gate of the output MOS transistor M0 and the GND terminal are short-circuited to thereby discharge the gate charge, which causes suppression of an increase in the gate voltage (pull-down of the gate voltage) so that the gate voltage remains 0V as shown in FIG. 3B. Because the gate voltage does not increase, the output MOS transistor M0 stays off, and no output current flows as shown in FIG. 3C.

In this embodiment, a power supply voltage is supplied to the L-load 2 and the OUT terminal of the semiconductor device 1 through the power supply switch 4a, and it is supplied to the Vcc terminal of the semiconductor device 1 through the power supply switch 4b. Due to time lag of several ms which occurs in the timing to turn on the power supply switches 4a and 4b depending on system, there is a possibility that a steep voltage rise can occur at the OUT terminal when no voltage is applied to the Vcc terminal as shown in FIG. 3A. In such a case, even if the OUT voltage rises, this configuration can avoid that the output MOS transistor M0 turns on by parasitic capacitors to cause a current to flow into the L-load.

As described in the foregoing, this embodiment can activate the gate pull-down circuit 13 of the output MOS transistor by utilizing the voltage applied to the OUT terminal even when no power supply voltage is applied to the Vcc terminal. Therefore, even if no power supply voltage Vcc is applied, it is possible to avoid an increase in the gate voltage due to parasitic capacitors to cause the output MOS transistor to turn on when a step-like voltage rise occurs in the OUT terminal. This prevents an unnecessary current from flowing into a load to thereby suppress erroneous operation of the load.

Further, because this embodiment directly refers to the voltage at the OUT terminal, not the voltage between the L-load and the power supply as taught by Seki shown in FIG. 8, it is possible to activate the gate pull-down circuit 13 accurately in accordance with the voltage applied to the output MOS transistor M0, thereby suppressing an increase in the gate voltage of the output MOS transistor M0. Since this embodiment directly adjusts the gate voltage of the output MOS transistor M0 rather than adjusting the input signal to the inverter connected to the gate as taught by Seki, it ensures to suppress an increase in the gate voltage.

Second Embodiment

A semiconductor device according to a second exemplary embodiment of the present invention is described hereinafter. The semiconductor device of this embodiment enables setting of an operating voltage of the gate pull-down circuit.

Figure 4:
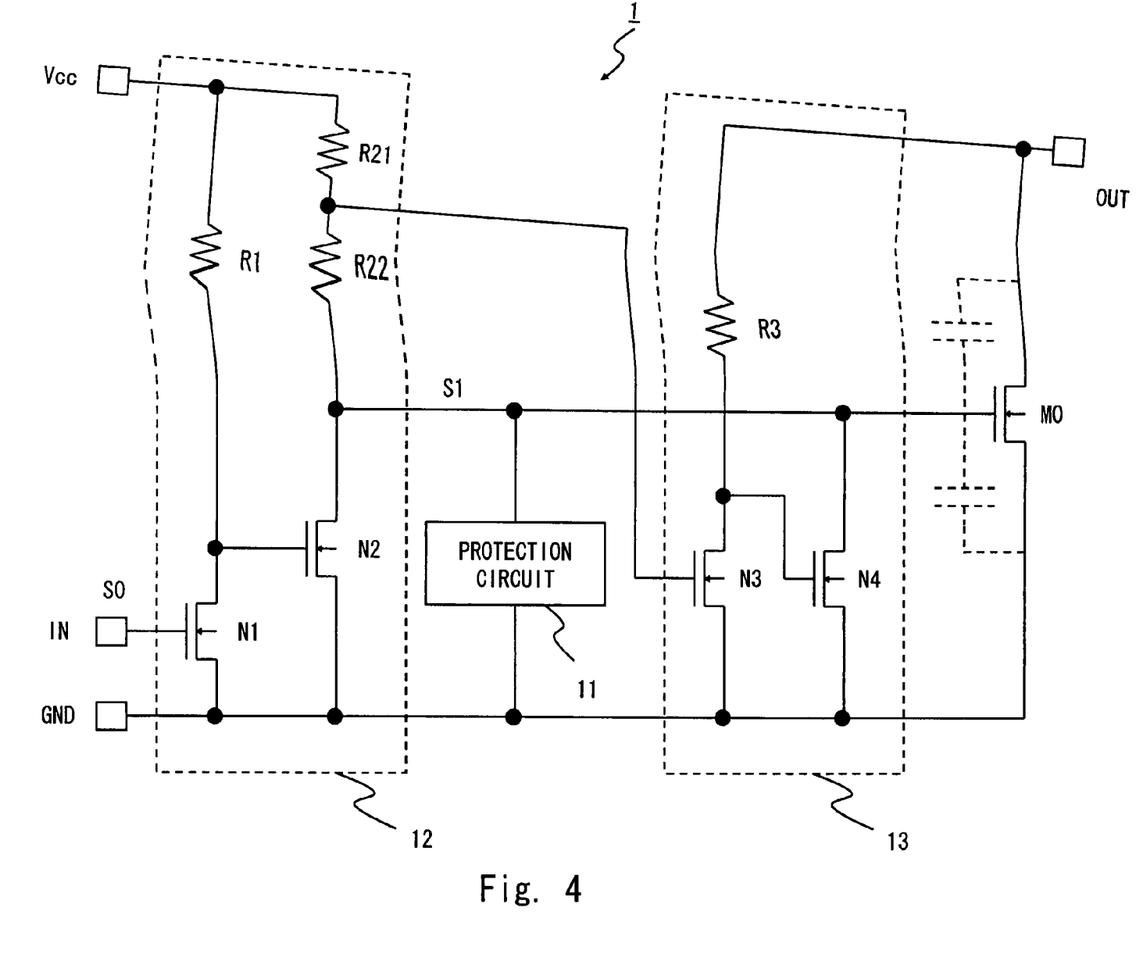
FIG. 4 is a circuit diagram showing the configuration of a semiconductor device according to an embodiment of the present invention.

FIG. 4 is a circuit diagram of the semiconductor device of this embodiment. In FIG. 4, the same elements as in FIG. 2 are denoted by the same reference symbols, and detailed description is not provided therefor. In this embodiment, the resistor R2 in the level shifter 12 is divided into a resistor R21 and a resistor R22, and the gate of the MOS transistor N3 in the gate pull-down circuit 13 is connected to the node between the resistors R21 and R22. Thus, if a divided voltage (cutoff voltage) which is divided from the voltage at the Vcc terminal is equal to or lower than the first level (a threshold of the MOS transistor N3), the MOS transistor N4 operates to detect the output voltage.

In the first embodiment, the MOS transistor N3 turns on when the voltage at the Vcc terminal exceeds the threshold voltage Vt of the MOS transistor N3, and the MOS transistor N4 is thereby cutoff so that the gate pull-down circuit 13 is cutoff. In this embodiment, on the other hand, the voltage Vb at which the gate pull-down circuit 13 is cutoff is (R21+R22)/R22*Vt, and it is possible to adjust the cutoff voltage Vb of the gate pull-down circuit 13 by adjusting the voltage dividing ratio of the resistors R21 and R22.

The above-described embodiments are given by way of illustration only, and it will be obvious to those skilled in the art that various changes may be made without departing from the scope of the invention. For example, although the switching element is described as a MOS transistor, other switching elements may be employed, such as IGBT (Insulated Gate Bipolar Transistor) Further, the conductivity type of the transistors in the above-described circuits may be altered.

It is apparent that the present invention is not limited to the above embodiment that may be modified and changed without departing from the scope and spirit of the invention.

What is claimed is:

1. A semiconductor device comprising:
   an output transistor connected between an output terminal connected with a load and a low-voltage terminal;
   a level shifter connected between a high-voltage terminal and the low-voltage terminal, to input a control signal generated by level-shifting an input signal to a control terminal of the output transistor;
   a first voltage detection transistor to control an electrical connection between the output terminal and the low-voltage terminal in accordance with a voltage at the high-voltage terminal; and
   a second voltage detection transistor to control an electrical connection between the control terminal of the output transistor and the low-voltage terminal in accordance with a voltage at the output terminal.

2. The semiconductor device according to claim 1, wherein a control terminal of the first voltage detection transistor is connected to the high-voltage terminal.

3. The semiconductor device according to claim 1, further comprising:
   a voltage dividing resistor to divide a voltage at the high-voltage terminal,
   wherein a control terminal of the first voltage detection transistor is connected to the voltage dividing resistor.

4. The semiconductor device according to claim 1, further comprising:
   a resistor element connected between the first voltage detection transistor and the output terminal,
   wherein a control terminal of the second voltage detection transistor is connected between the first voltage detection transistor and the resistor element.

5. A semiconductor device comprising:
   an output terminal connected to a power supply through a load;
   an output transistor to control a current flowing into the load through the output terminal; and
   a pull-down circuit to pull down the output transistor in accordance with a voltage at the output terminal when a voltage at a high-voltage terminal through which power is supplied is equal to or lower than a prescribed level
   a first and a second voltage dividing resistors to divide the voltage at the high-voltage terminal,
   wherein the pull-down circuit comprises:
   a first voltage detector connected between the first and the second voltage dividing resistors, to detect whether or not a voltage between the first and the second voltage dividing resistors is eciual to or lower than a first level; and
   a second voltage detector to detect whether or not a voltage at the output terminal is equal to or higher than a second level, wherein
   the first voltage detector turns on a voltage detecting function of the second voltage detector when the voltage between the first and the second voltage dividing resistors is equal to or lower than the first level, and
   the second voltage detector pulls-down the output transistor when the voltage at the output terminal is equal to or higher than the second level.

6. The semiconductor device according to claim 5, wherein the pull-down circuit comprises:
   a first voltage detector to detect whether or not the voltage at the high-voltage terminal is equal to or lower than a first level; and
   a second voltage detector to detect whether or not a voltage at the output terminal is equal to or higher than a second level.

7. The semiconductor device according to claim 6, wherein the first voltage detector turns on a voltage detecting function of the second voltage detector when the voltage at the high-voltage terminal is equal to or lower than the first level, and the second voltage detector pulls-down the output transistor when the voltage at the output terminal is equal to or higher than the second level.

* * * * *